(12) United States Patent
Shima

(10) Patent No.: US 11,747,692 B2
(45) Date of Patent: Sep. 5, 2023

(54) DISPLAY DEVICE

(71) Applicant: Japan Display Inc., Tokyo (JP)

(72) Inventor: Takehiro Shima, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/876,057

(22) Filed: Jul. 28, 2022

(65) Prior Publication Data

US 2022/0365381 A1 Nov. 17, 2022

Related U.S. Application Data

(63) Continuation of application No. PCT/JP2020/044310, filed on Nov. 27, 2020.

(30) Foreign Application Priority Data

Jan. 30, 2020 (JP) ................................. 2020-013462

(51) Int. Cl.
*G02F 1/1368* (2006.01)
*G02F 1/1362* (2006.01)

(52) U.S. Cl.
CPC ...... *G02F 1/1368* (2013.01); *G02F 1/136286* (2013.01)

(58) Field of Classification Search
CPC .................................................. G02F 1/1368
See application file for complete search history.

(56) References Cited

U.S. PATENT DOCUMENTS

| 5,610,414 A | 3/1997 | Yondeda et al. |
| 2003/0174107 A1 | 9/2003 | Watanabe et al. |
| 2004/0004593 A1* | 1/2004 | Okumura ......... H03K 19/00384 |
| | | 345/87 |
| 2004/0124442 A1 | 7/2004 | Koyama |

(Continued)

FOREIGN PATENT DOCUMENTS

| JP | H07-120788 A | 5/1995 |
| JP | 2003-270660 A | 9/2003 |

(Continued)

OTHER PUBLICATIONS

International Search Report issued in International Patent Application No. PCT/JP2020/044310 dated Jan. 19, 2021 and English translation of same. 7 pages.

(Continued)

*Primary Examiner* — Sang V Nguyen
(74) *Attorney, Agent, or Firm* — K&L Gates LLP

(57) ABSTRACT

According to one embodiment, a display device includes a display area where a plurality of pixels are arrayed, a first drive circuit arranged adjacent to the display area in a first direction, the first drive circuit configured to supply a drive signal to a gate electrode included in each of switching elements, and a memory power line extending in a second direction intersecting the first direction in the display area and configured to supply a potential to a memories. An outer edge of the display area is defined by outermost edges of the pixels located on an outermost side in the display area. A first distance from the first drive circuit to the outer edge is shorter than a second distance from the first drive circuit to the memory power line.

18 Claims, 11 Drawing Sheets

(56) References Cited

U.S. PATENT DOCUMENTS

| | | | |
|---|---|---|---|
| 2005/0012726 A1* | 1/2005 | Fujikawa | G09G 3/3648 |
| | | | 345/204 |
| 2009/0231268 A1* | 9/2009 | Yamada | G09G 3/344 |
| | | | 345/107 |
| 2012/0057091 A1 | 3/2012 | Kawabata et al. | |
| 2014/0085349 A1 | 3/2014 | Shiibayashi et al. | |
| 2017/0061872 A1* | 3/2017 | Zhou | G09G 3/3266 |
| 2017/0221434 A1 | 8/2017 | Shima | |
| 2018/0108863 A1* | 4/2018 | Kajiyama | G09G 3/3233 |

FOREIGN PATENT DOCUMENTS

| | | |
|---|---|---|
| JP | 2007-093685 A | 4/2007 |
| JP | 2007-093845 A | 4/2007 |
| JP | 2009-244841 A | 10/2009 |
| JP | 2012-145947 A | 8/2012 |
| JP | 2014-071132 A | 4/2014 |
| JP | 2017-134339 A | 8/2017 |
| JP | 2019-056796 A | 4/2019 |

OTHER PUBLICATIONS

Written Opinion issued in International Patent Application No. PCT/JP2020/044310 dated Jan. 19, 2021. 5 pages.

* cited by examiner

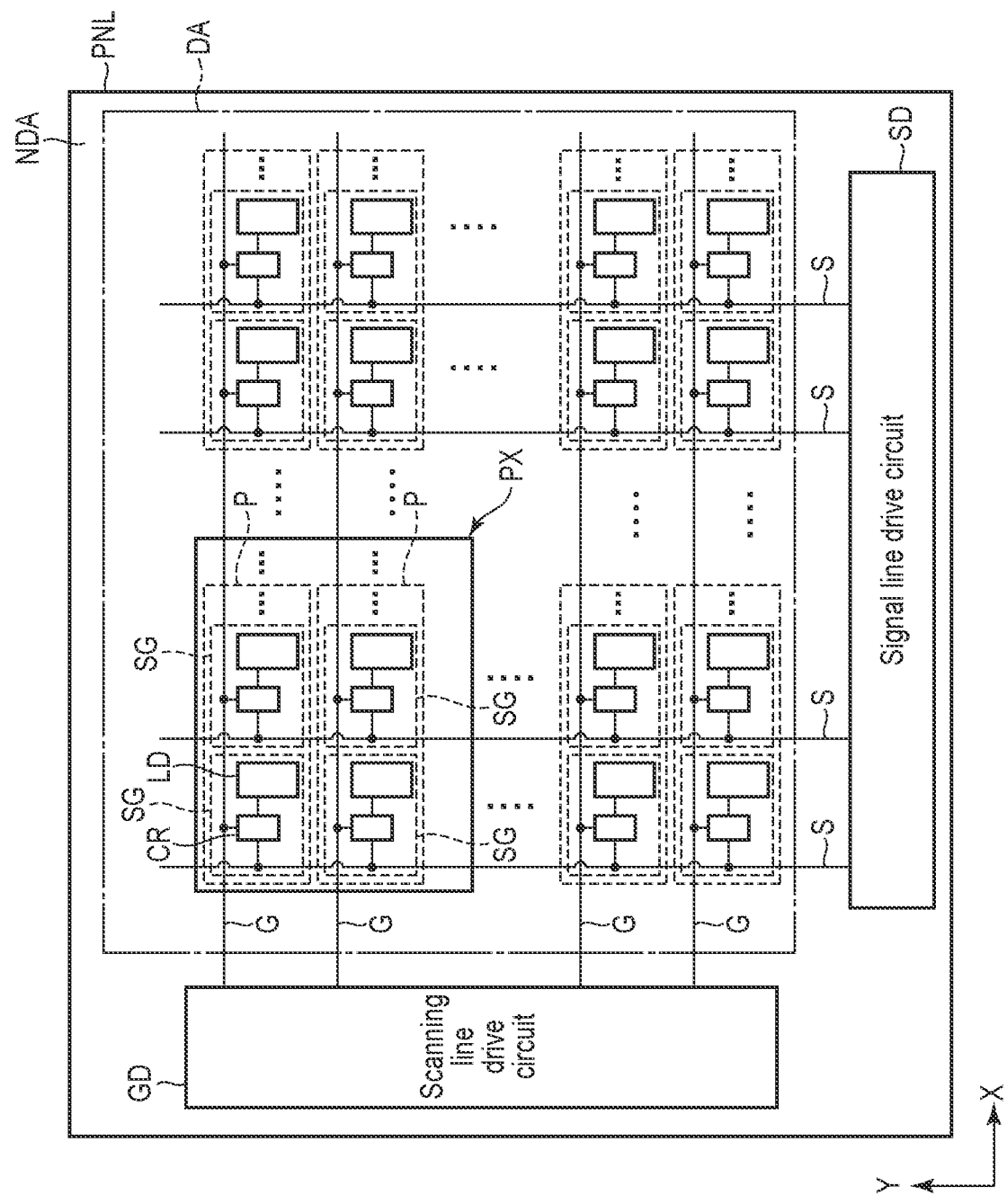
F I G. 2

F.I.G.6

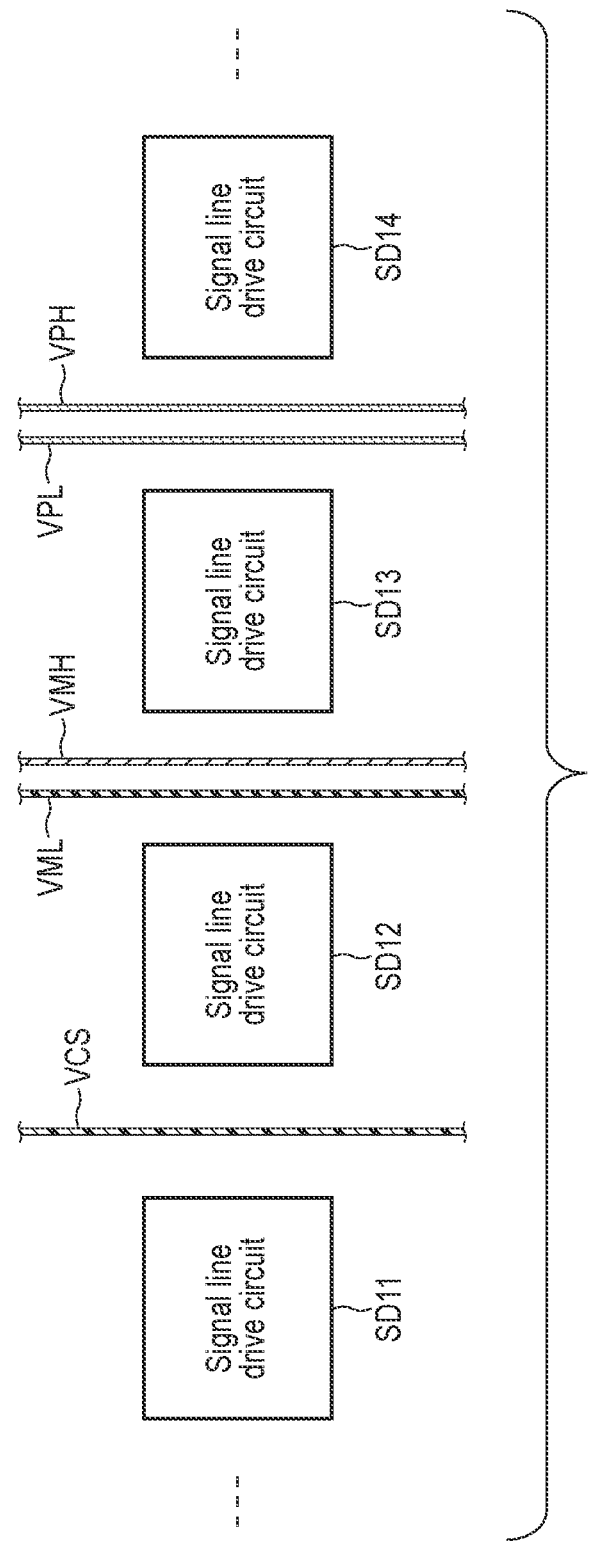
F I G. 11

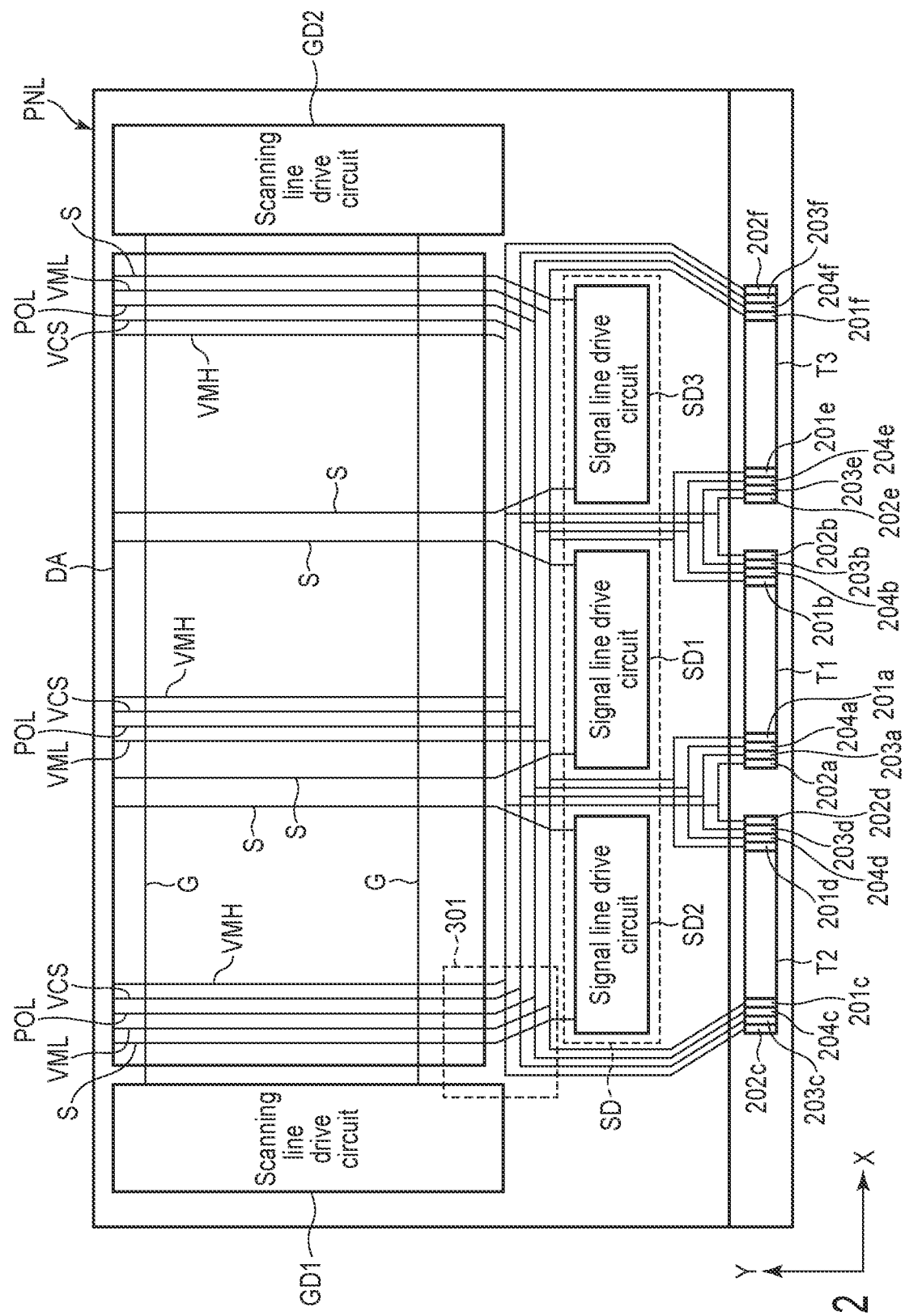
F I G. 12

DISPLAY DEVICE

CROSS-REFERENCE TO RELATED APPLICATIONS

This application is a Continuation Application of PCT Application No. PCT/JP2020/044310, filed Nov. 27, 2020 and based upon and claiming the benefit of priority from Japanese Patent Application No. 2020-013462, filed Jan. 30, 2020, the entire contents of all of which are incorporated herein by reference.

FIELD

Embodiments described herein relate generally to a display device.

BACKGROUND

As a display device, a reflective liquid crystal display device that employs Memory In Pixel (MIP) scheme which includes a memory capable of storing data as display information in pixels, is known.

In such a liquid crystal display device, a memory power line for supplying a voltage to each memory is formed on a display panel board, but the memory power line may be an obstacle for narrowing a frame of the display panel.

BRIEF DESCRIPTION OF THE DRAWINGS

FIG. 2 is a view illustrating an example of a configuration of a display panel.

FIG. 11 is a view illustrating another example of the line formed between the signal line drive circuits.

FIG. 12 is a view illustrating a modified example of the embodiment.

DETAILED DESCRIPTION

Figure 1:
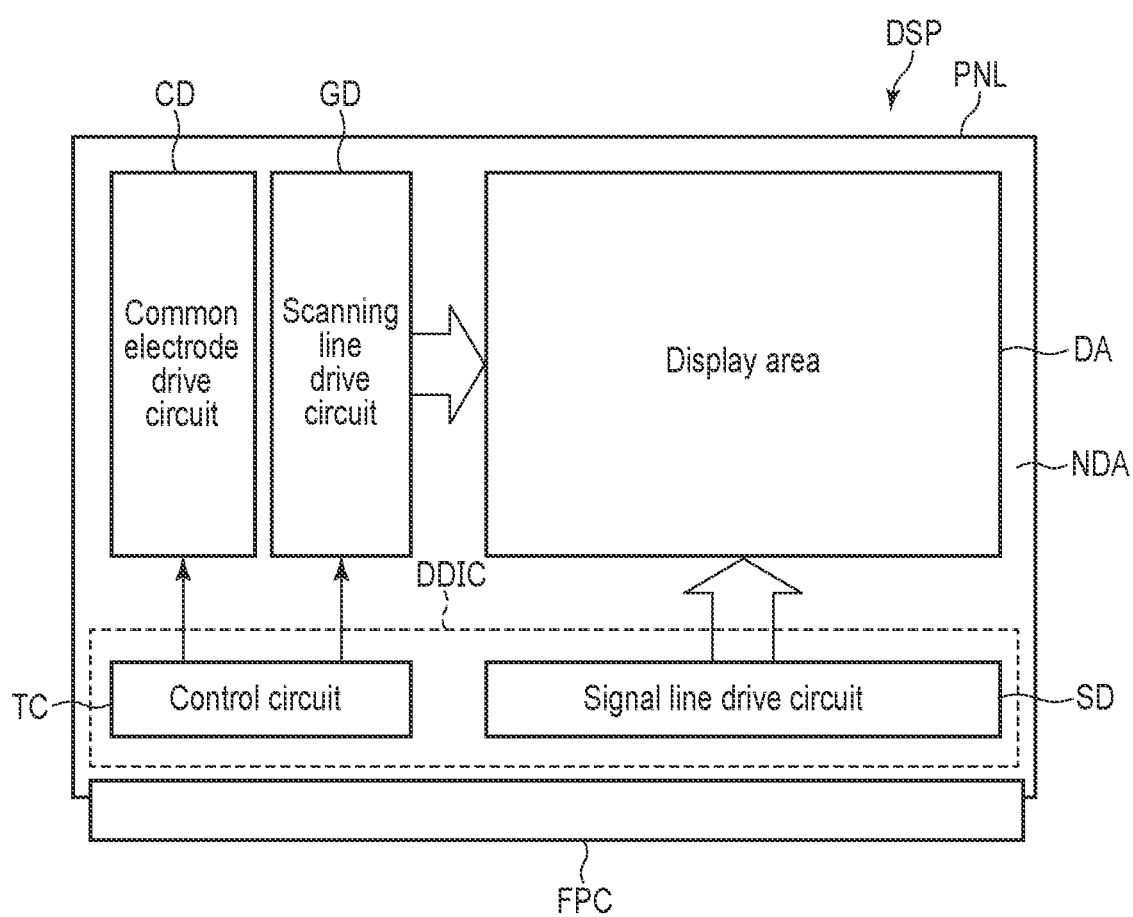
FIG. 1 is a view showing a schematic configuration of a display device according to an embodiment.

In general, according to one embodiment, a display device includes a display area where a plurality of pixels including switching elements and memories connected to the switching elements are arrayed, a first drive circuit arranged adjacent to the display area in a first direction, the first drive circuit configured to supply a drive signal to a gate electrode included in each of the switching elements, and a memory power line extending in a second direction intersecting the first direction in the display area and configured to supply a potential to the memories. An outer edge of the display area is defined by outermost edges of the pixels located on an outermost side in the display area. A first distance from the first drive circuit to the outer edge of the display area is shorter than a second distance from the first drive circuit to the memory power line.

Various embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements which function in the same or a similar manner to those described in connection with preceding drawings are denoted by like reference numbers, detailed description thereof being omitted unless necessary.

The embodiment discloses a liquid crystal display device as an example of the display device, and the display device can be applied to, for example, various devices such as smartphones, tablet terminals, cellular phone terminals, personal computers, television receivers, in-vehicle devices, and game consoles. In addition, the display device according to the embodiment may be used for, for example, a wristwatch-type wearable device, signage (electronic board), and the like. A main configuration disclosed in the embodiment can also be applied to a self-luminous display device including an organic electroluminescent (EL) display element and the like, an electronic paper-type display device including an electrophoretic element and the like, a display device to which micro-electromechanical systems (MEMS) is applied, a display device to which electrochromism is applied, or the like, as well as the liquid crystal display device.

FIG. 1 is a view showing a schematic configuration of a display device DSP according to the embodiment. As shown in FIG. 1, the display device DSP includes a display panel PNL. The display panel PNL includes a display area DA in which images are displayed, and a frame-like non-display area NDA which surrounds the display area DA (i.e., an area located around the display area DA). A plurality of pixels are arranged, for example, in a matrix in the display area DA. Each of the plurality of pixels includes a switching element, a pixel electrode, a common electrode, and the like. As the switching element, for example, a thin film transistor (TFT) is used. The configuration of the display panel PNL will be described later.

In addition, the display panel PNL includes a signal line drive circuit SD, a scanning line drive circuit GD, a common electrode drive circuit CD, and a control circuit (timing controller) TC.

The signal line drive circuit SD is electrically connected to a source electrode of the switching element included in each of the plurality of pixels via a signal line (source line).

The scanning line drive circuit GD is electrically connected to a gate electrode of the switching element included in each of the plurality of pixels via a scanning line (gate line).

The above-described signal lines and scanning lines are formed in different layers (i.e., the lines are constituted in separate layers).

In addition, a drain electrode of the switching element included in each of the plurality of pixels is electrically connected to a memory to be described later.

The common electrode drive circuit CD is electrically connected to a common electrode disposed to be opposed to a pixel electrode via a liquid crystal layer.

The control circuit TC generates various timing signals for driving the signal line drive circuit SD, the scanning line drive circuit GD, and the common electrode drive circuit CD. The control circuit TC is accommodated in the DDIC together with the signal line drive circuit SD.

In the display panel PNL, an image can be displayed in the display area DA by driving the signal line drive circuit SD, the scanning line drive circuit GD, and the common electrode drive circuit CD based on timing signals from the control circuit TC.

The display device DSP further includes a flexible wiring board FPC for connecting the display panel PNL to an external device such as a CPU. At least several parts of the signal line drive circuit SD, the scanning line drive circuit CD, the common electrode drive circuit, CD, and the control circuit TC shown in FIG. 1 may be provided on the flexible wiring board FPC.

Next, an example of the configuration of the display panel PNL will be described with reference to FIG. 2. The common electrode drive circuit CD and the control circuit TC are omitted in FIG. 2.

The display panel PNL includes pixels PX, signal lines S, scanning lines G, and the like in the display area DA.

A plurality of pixels (unit pixels) PX are regularly arrayed on an X-Y plane defined by the first direction X and the second direction Y. The pixel PX is the minimum unit that constitutes a color image. The pixel PX is composed of a plurality of sub-pixels P. More specifically, one pixel PX includes, for example, a sub-pixel that displays a red color, a sub-pixel that displays a green color, a sub-pixel that displays a blue color, and a sub-pixel that displays a white color, as the sub-pixels P.

The colors displayed by the plurality of sub-pixels P are not limited to these four colors. The plurality of sub-pixels P may be any sub-pixels that display a plurality of different colors, for example, a sub-pixel that displays a red color, a sub-pixel that displays a green color closer to a red color, a sub-pixel that displays a green color closer to a blue color, a sub-pixel that displays a blue color, and the like.

Furthermore, each sub-pixel P is composed of a plurality of segment pixels SG. Although the details will be described later, the segment pixel SG includes a liquid crystal element LD and a pixel circuit CR connected to the liquid crystal element LD. In addition, although not shown in FIG. 2, the liquid crystal element LD is formed by a pixel electrode, a part of the common electrode which is opposed to the pixel electrode, and a liquid crystal layer located between the pixel electrode and the part of the common electrode. The pixel electrode is formed to include at least a metal layer, and reflects light from the outside by the metal layer. In addition, signal line S and the scanning line G are connected to the pixel circuit CR.

The display panel PNL of the embodiment includes a reflection display function of displaying an image by selectively reflecting, for example, incident light from the display surface side such as external light or auxiliary light by the pixel electrodes of each segment pixel SG. The display panel PNL of this type is referred to as a reflective display panel.

The plurality of signal lines S extend in the second direction Y and are arranged in the first direction X. In addition, each of the plurality of signal lines S is connected to the signal line drive circuit SD. The signal line drive circuit SD outputs the pixel signal to be supplied to the pixel circuit CR of each segment pixel SG to the corresponding signal line S in a time-division manner.

The plurality of scanning lines G extend in the first direction X and are arranged in the second direction Y intersecting the first direction X. In addition, the plurality of scanning lines G are connected to the scanning line drive circuit GD. The scanning line drive circuit GD outputs a gate drive signal that controls the operation of writing the pixel signal to the segment pixel SG to the corresponding scanning line G. As a result, the gate drive signal is supplied to the gate electrode of the switching element included in the segment pixel SG.

The signal line drive circuit SD and the scanning line drive circuit GD are formed in the non-display area NDA of the display panel PNL, but one or both of these circuits may be built in an IC chip mounted on the display panel PNL or may be formed on a flexible printed circuit board FPC connected to the display panel PNL.

In addition, only one scanning line drive circuit GD is shown in FIG. 2, but the display panel PNL may be configured to include a plurality of (for example, two) scanning line drive circuits GD. If the display panel PNL is configured to include two scanning line drive circuits GD, for example, some of the scanning lines G are connected to one of the scanning line drive circuits GD and the remaining scanning lines G are connected to the other scanning line drive circuit GD. In this case, some of the scanning lines G connected to one of the scanning line drive circuit GD may be the scanning lines G of odd-numbered rows, and the remaining scanning lines G connected to the other scanning line drive circuit GD may be the scanning lines G of even-numbered rows. Furthermore, the scanning lines G in the same line may be divided into a scanning line G connected to one of the scanning line drive circuit GD and a scanning line G connected to the other scanning line drive circuit GD. In addition, the two scanning line drive circuits GD may be configured to be connected to the same scanning line G. The two scanning line drive circuits GD are disposed to face each other with the display area DA interposed therebetween.

Figure 3:
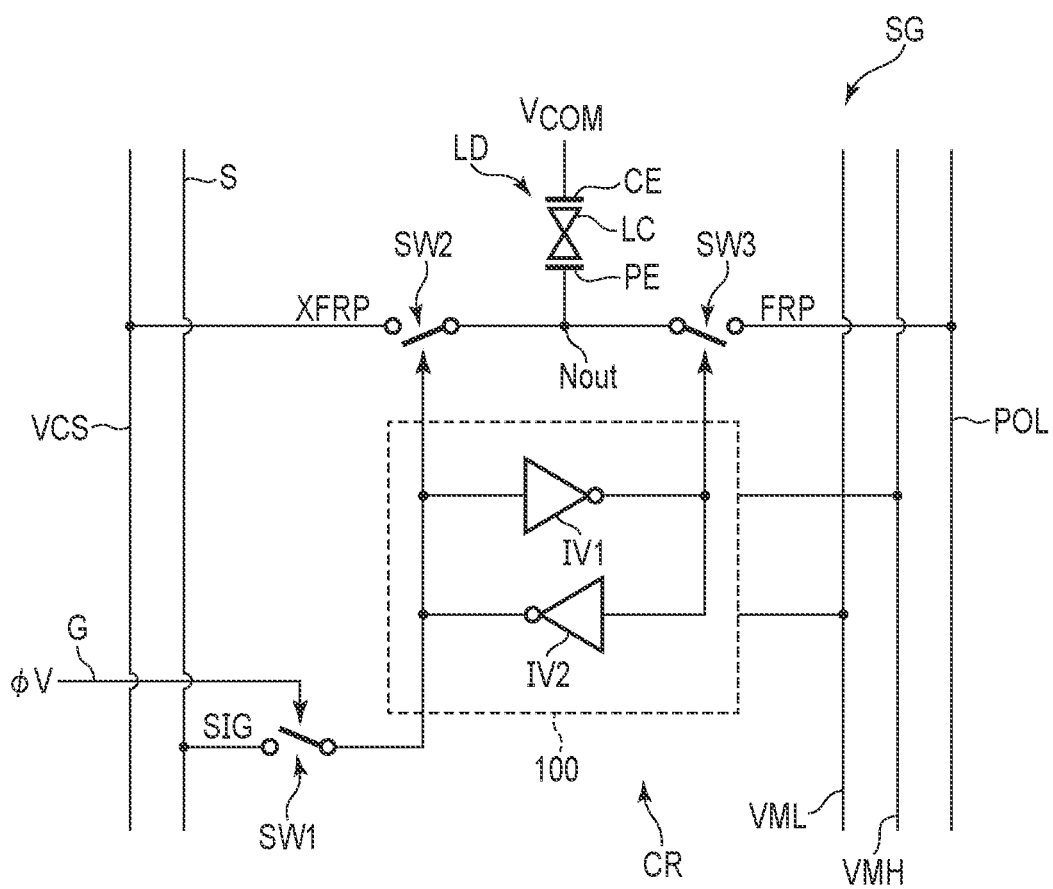
FIG. 3 is a view showing an example of a configuration of a pixel circuit and a liquid crystal element provided in a segment pixel.

FIG. 3 shows an example of the configuration of the pixel circuit CR and the liquid crystal element LD provided in the segment pixel SG shown in FIG. 2.

The display device DSP according to the embodiment has a configuration that employs a Memory In Pixel (MIP) scheme which includes a memory capable of storing a pixel signal in each segment pixel SG. In addition, in the embodiment, the pixel signal is substantially binary data (logic "1" or logic "0"). According to such a configuration, binary data can be stored in the memory in the segment pixel SG, and the on state and the off state of the segment pixel SG can be realized based on the binary data. In addition, one sub-pixel P is composed of a plurality of segment pixels SG having the same or different area, and the on-state pixel area of the sub-pixel P changes depending on a combination of the on and off states of the plurality of segment pixels SG. Gradation display in each sub-pixel P is realized by such a difference in the pixel area in the on state. Such a gradation expression method is also referred to as an area gradation method. According to the area gradation method, for example, 2n gradations can be expressed with N segment pixels SG obtained by weighing the area proportion of the pixel electrode as 20, 21, 22, . . . , 2n−1.

Since the display device DSP employing the above-described MIP scheme realizes the display by using the pixel signal held in the memory and holds the display, the display device DSP does not need to execute rewriting (refresh) of the pixel signal of each pixel in a predetermined frame period.

In addition, only a part of the image (display screen) displayed in the display area DA may be rewritten. In this case, rewriting can be executed by partially rewriting the pixel signal of the segment pixel SG. In other words, it is unnecessary to output the pixel signal only to the segment pixel SG that needs to be rewritten, and to output the pixel signal to the segment pixel SG that does not need to be rewritten.

For this reason, there is an advantage in the display device DSP adopting the MIP method that refreshing the pixel signal in the frame cycle is unnecessary and, as a result, power consumption can be suppressed.

One segment pixel SG includes the liquid crystal element LD and the pixel circuit CR as described above. The pixel electrode PE, the common electrode CE, and the liquid crystal layer LC shown in FIG. 3 constitute the liquid crystal element LD.

The pixel electrode PE is disposed in each of the segment pixels SG and electrically connected to the pixel circuit CR. The common electrode CE is opposed to the plurality of or all the pixel electrodes PE via the liquid crystal layer LC. A common voltage Vcom is applied to the common electrode CE by the common electrode drive circuit CD. The liquid crystal element LD generates an electric field by the potential difference between the pixel electrode PE and the common electrode CE, and the liquid crystal molecules of the liquid crystal layer LC rotate according to the electric field strength. The optical characteristics of each liquid crystal element LD change due to the rotation of the liquid crystal molecules, and a bright state (bright display/white display) and a dark state (dark display/black display) are formed in units of the liquid crystal elements LD. An image is formed in the display area DA by causing such a change in display in units of the liquid crystal elements LD to occur in the entire display area DA.

The pixel circuit CR includes three switches SW1 to SW3 and a memory 100 (latch portion).

The switch SW1 is composed of, for example, an Nch MOS transistor. In the switch SW1, one end of the switch SW1 is connected to the signal line S, and the other end is connected to the memory 100.

The on and off states of the switch SW1 are controlled by the gate drive signal (control signal) supplied from the scanning line G. More specifically, the switch SW1 is supplied with a gate drive signal φV from the scanning line drive circuit GD via the scanning line G and thereby becomes the on state. As a result, the pixel signal (signal of logic "1" or logic "0") SIG supplied from the signal line drive circuit SD via the signal line S is taken into the segment pixel SG. The signal line S to which the pixel signal SIG is supplied from the signal line drive circuit SD is selected based on the source drive signal input to the signal line drive circuit SD. In contrast, when the gate-off potential is supplied from the scanning line drive circuit GD via the scanning line G, the switch SW1 becomes the off state. In this case, the segment pixel SG is electrically separated from the signal line S, and the pixel signal SIG is not supplied from the signal line S to the segment pixel SG.

The memory 100 includes inverters IV1 and IV2. In this case, an output terminal of the inverter IV1 is connected to an input terminal of the inverter IV2, and an output terminal of the inverter IV2 is connected to an input terminal of the inverter IV1. Nodes on the sides of the input terminal of the inverter IV1 and the output terminal of the inverter IV2 are connected to the switch SW2, and nodes on the sides of the output terminal of the inverter IV1 and the input terminal of the inverter IV2 are connected to the switch SW3. Each of the inverters IV1 and IV2 is, for example, a CMOS inverter, which is composed of a plurality of TFTs. Thus, the memory 100 has an SRAM structure that holds (latches) the potential corresponding to the pixel signal SIG supplied via the switch SW1.

When the common voltage Vcom supplied to the common electrode is an AC voltage in which two predetermined potentials are switched in a predetermined cycle, a voltage XFRP having a phase opposite to the common voltage Vcom is supplied to one of ends of the switch SW2, and a voltage XFRP having the same phase as the common voltage Vcom is supplied to one of ends of the switch SW3. In contrast, when the common voltage Vcom is a DC voltage, the AC voltage XFRP as described above is supplied to one of ends of the switch SW2, and the same potential as the common voltage Vcom is supplied to one of ends of the switch SW3. The other ends of the switches SW2 and SW3 are connected to each other and are also electrically connected to the pixel electrode PE to constitute an output node Nout of the pixel circuit CR.

One of the switches SW2 and SW3 becomes the on state (and, at the same time, the other becomes the off state) according to the polarity of the holding potential (pixel signal stored in the memory 100) of the memory 100. As a result, a voltage XFRP having a phase opposite to or a voltage FRP having the same phase as the voltage applied to the common electrode is applied to the pixel electrode PE.

The memory 100 is connected to a first memory power line VML that supplies a low voltage to the memory 100 and a second memory power line VMH that supplies a high voltage to the memory 100.

In addition, the voltage XFRP is supplied to the above-described switch SW2 via a first display potential line (reference signal line) VCS, and the voltage FRP is supplied to the switch SW3 via a second display potential line (polarity signal line) POL.

Figure 4:
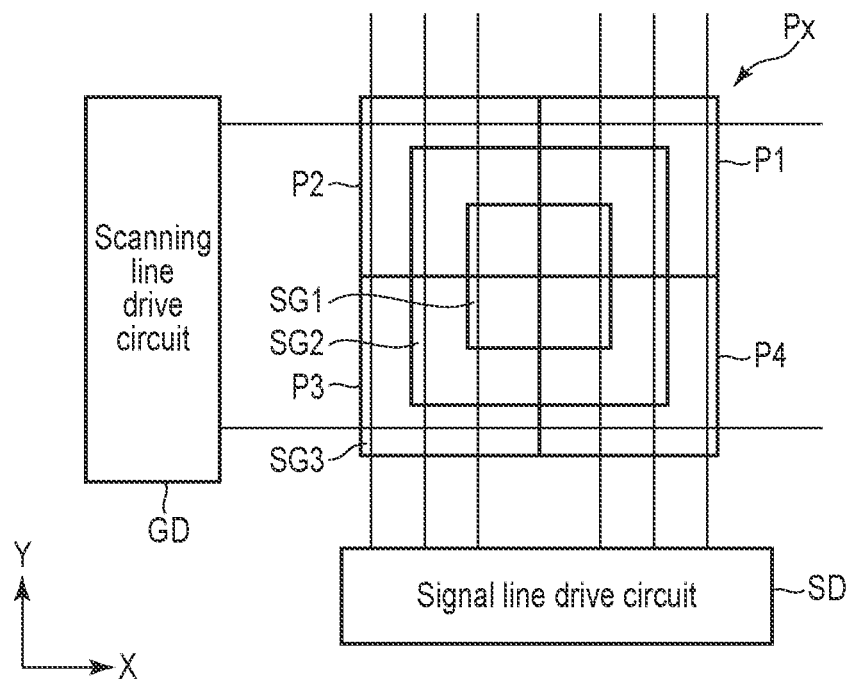
FIG. 4 is a view illustrating an arrangement example of sub-pixels and segment pixels constituting a pixel.

Next, an example of arrangement of the sub-pixels P and the segment pixels SG that constitute the pixel PX in the embodiment will be described with reference to FIG. 4. In FIG. 4, only one pixel PX is illustrated for convenience of descriptions.

In the example shown in FIG. 4, the pixel PX includes four sub-pixels P1 to P4 in SQUARE array. The sub-pixel P1 is, for example, a sub-pixel that displays a red color. The sub-pixel P2 is, for example, a sub-pixel that displays a green color. The sub-pixel P3 is, for example, a sub-pixel that displays a blue color. The sub-pixel P4 is, for example, a sub-pixel that displays a white color. The color displayed in each of the sub-pixels P1 to P4 is realized by a color filter disposed to be opposed to the pixel electrode PE of each of the sub-pixels P1 to P4.

The sub-pixels P1 and P2 are arranged to be adjacent to each other along the first direction X. The sub-pixels P3 and P4 are arranged to be adjacent to each other along the first direction X. In addition, the sub-pixels P1 and P4 are arranged to be adjacent to each other along the second direction Y. Furthermore, the sub-pixels P2 and P3 are arranged to be adjacent to each other along the second direction Y.

Each of the sub-pixels P1 to P4 is composed of a plurality of segment pixels SG. An example of the segment pixels SG constituting the sub-pixel P3 among the sub-pixels P1 to P4 will be described below.

As shown in FIG. 4, the sub-pixel P3 includes segment pixels SG1 to SG3. The segment pixel SG1 is formed in a substantially square (quadrangular) shape, and is disposed at a corner part of the sub-pixel P3, which is formed by a boundary line of the sub-pixels P2 and P3 and a boundary line of the sub-pixels P3 and P4. The segment pixel SG2 is formed in an L-letter shape and is disposed at a position which is in contact with the segment pixel SG1. The segment pixel SG3 is formed in an L-letter shape and is disposed at a position which is in contact with the segment pixel SG2. The sub-pixel P3 has a rectangular shape formed by combining the above-described segment pixels SG1 to SG3. The shapes of the segment pixels SG1 to SG3 may be other than the shapes described here.

It is assumed that the segment pixels SG1 to SG3 are formed to set an area ratio to, for example, 1:2:4 (=20:21:22). In the embodiment, this area ratio is based on the area of the region that substantially contributes to the display in each segment pixel SG, and does not include the area of the region that does not contribute to the display and overlaps with, for example, the connection portion, the light-shielding layer or the like. In contrast, for example, the area ratio of the segment pixels SG1 to SG3 including the connecting portion can also be set to 1:2:4.

The segment pixel SG1 is a display region corresponding to the least significant bit (for example, 20) in the 3-bit area gradation. The segment pixel SG3 is a display region corresponding to the most significant bit (for example, 22) in the 3-bit area gradation. The segment pixel SG2 is a display region corresponding to an intermediate bit (for example, 21) in the 3-bit area gradation. The 3-bit area gradation display can be executed by the combination of these segment pixels SG1 to SG3.

The combination of the area ratio of the segment pixels SG1 to SG3 is not limited to the above example.

The sub-pixel P3 (segment pixels SG1 to SG3) has been described, but the other sub-pixels P1, P2, and P4 are also composed of three segment pixels SG.

More specifically, the sub-pixel P1 includes three segment pixels SG corresponding to the segment pixels SG1 to SG3 disposed to have point symmetry with the sub-pixel P3 with respect to the intersection of the boundary line of the sub-pixels P2 and P3 and the boundary line of the sub-pixels P3 and P4 (that is, the center point of the pixel PX).

The sub-pixel P2 includes three segment pixels SG corresponding to the respective segment pixels SG1 to SG3 disposed to have line symmetry with the sub-pixel P3 with respect to the boundary line of the sub-pixels P2 and P3.

The sub-pixel P4 includes three segment pixels SG corresponding to the respective segment pixels SG1 to SG3 disposed to have line symmetry with the sub-pixel P3 with respect to the boundary line of the sub-pixels P3 and P4.

Each of the sub-pixels P1 to P4 is partitioned by light-shielding layers. Similarly, each of the segment pixels SG that constitute each of the sub-pixels P1 to P4 is partitioned by light-shielding layers.

All the sub-pixels P1 to P4 have the same area in the example shown in FIG. 4, but the area of the sub-pixels P1 to P4 may be different. In other words, the area ratio of the sub-pixels P1 to P4 may be changed.

By the way, each of the segment pixels SG that constitute each of the sub-pixels P1 to P4 includes the pixel circuit CR as described above. For this reason, when the sub-pixels P1 to P4 and a plurality of segment pixels SG that constitute each of the sub-pixels P1 to P4 are disposed in the pixel PX as shown in FIG. 4, the same number of signal lines S as the number of segment pixels SG disposed in the first direction X in the display panel PNL are connected to the signal line drive circuit SD. The signal line S is shared in, for example, the sub-pixels P (segment pixels SG) adjacent to each other in the second direction Y, such as the sub-pixels P1 and P4.

In contrast, the same number of scanning lines G as the number of sub-pixels P disposed in the second direction Y are connected to the scanning line drive circuit GD. The scanning line G is shared in, for example, the sub-pixels P (segment pixels SG) adjacent to each other in the first direction X, such as the sub-pixels P1 and P2.

Figure 5:
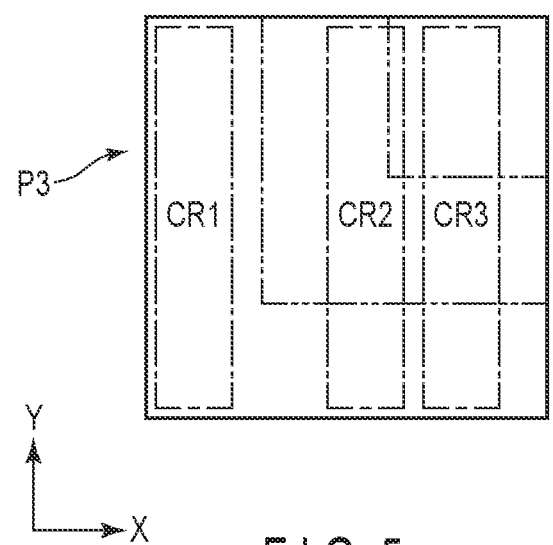
FIG. 5 is a view showing an example of a layout of a pixel circuit provided in each of the segment pixels constituting the sub-pixel.

FIG. 5 shows an example of a layout of the pixel circuit CR (i.e., the region where the pixel circuit CR is disposed) provided in each of the segment pixels SG1 to SG3 that constitute, for example, the sub-pixel P3 shown in FIG. 4.

The pixel circuits CR provided in each of the segment pixels SG1 to SG3 are referred to as pixel circuits CR1 to CR3, respectively.

In the example shown in FIG. 5, the pixel circuits CR1 to CR3 (i.e., regions where the pixel circuits are formed) extend in the second direction Y in the region in the sub-pixel P3 in planar view, and are arranged in the first direction X.

Each of the pixel circuits CR1 to CR3 is disposed in a layout as shown in FIG. 5, but each of the segment pixels SG1 to SG3 (i.e., each pixel electrode PE) is formed in the above-described shape shown in FIG. 4.

In this case, for example, the liquid crystal element LD connected to the pixel circuit CR1 has the same planar shape as the segment pixel SG1 (pixel electrode PE).

In addition, the liquid crystal element LD connected to the pixel circuit CR2 has the same planar shape as the segment pixel SG2 (pixel electrode PE).

Furthermore, the liquid crystal element LD connected to the pixel circuit CR3 has the same planar shape as the segment pixel SG3 (pixel electrode PE).

The only layout of the pixel circuits CR provided in each of the segment pixels SG1 to SG3 constituting the sub-pixel P3 has been described, but the other sub-pixels P1, P2, and P4 are constituted in the same manner.

Each of the plurality of segment pixels SG is configured to include one liquid crystal element LD (pixel electrode PE) and one pixel circuit CR, and the pixel electrode PE forms a pixel electrode layer formed by arranging a plurality of pixel electrodes PE, and the pixel circuit CR forms a pixel circuit layer formed by arranging a plurality of pixel circuits CR.

The display device DSP according to the embodiment is not a transmissive display device, but a reflective display device, and each pixel electrode PE includes a metal layer for reflection as described above. In addition, the above-described pixel circuit layer is provided under the pixel electrode layer via the flattening film layer. According to this, the display image is formed by the reflection on the pixel electrode PE, while the circuit shape under the pixel electrode layer does not affect the display. For this reason, the planar shape of each pixel electrode PE in the pixel electrode layer does not need to correspond to the planar shape of each pixel circuit CR of the pixel circuit layer provided under the pixel electrode layer, and the planar shapes can be made separately as shown in FIG. 5.

More specifically, while the arrangement and size of the plurality of segment pixels SG differ depending on the number of bits and the definition of the area gradation, each pixel circuit CR has the same configuration and is formed in the same planar shape. Therefore, as shown in FIG. 5, the configuration in which three pixel electrodes PE having a shape different from that of the pixel circuits CR overlap with the pixel circuits CR of the three segment pixels SG as shown in FIG. 5 can be employed. Furthermore, the region where the plurality of segment pixels SG constituting one sub-pixel P are disposed does not need to correspond to the region where the plurality of pixel circuits CR for driving the plurality of segment pixels SG, respectively, are arranged, and they may be displaced vertically, horizontally, and the like in planar view.

The display device DSP according to the embodiment has a configuration in which the memory 100 is provided in each segment pixel SG as described above, and the first memory power line VML and the second memory power line VMH are connected to the memory 100. In addition, the first display potential line (reference voltage line) VCS and the second display potential line (polarity voltage line) POL are connected to the pixel circuit CR provided in each of the above-described segment pixels SG. More specifically, the display potential lines VCS and POL are connected to the pixel electrode PE via the switches SW2 and SW3.

When a potential line group including the first memory power line VML, the second memory power line VMH, the first display potential line VCS, and the second display potential line POL is provided between the scanning line drive circuit GD and the display area DA, narrowing the frame on the side portion of the display area DA is hindered.

Therefore, in the embodiment, narrowing the frame on the display panel PNL is realized by the configuration in which the above-described lines (first memory power line VML, second memory power line VMH, first display potential line VCS, and second display potential line POL) are not formed in the region between the scanning line drive circuit GD and the display area DA.

Figure 6:
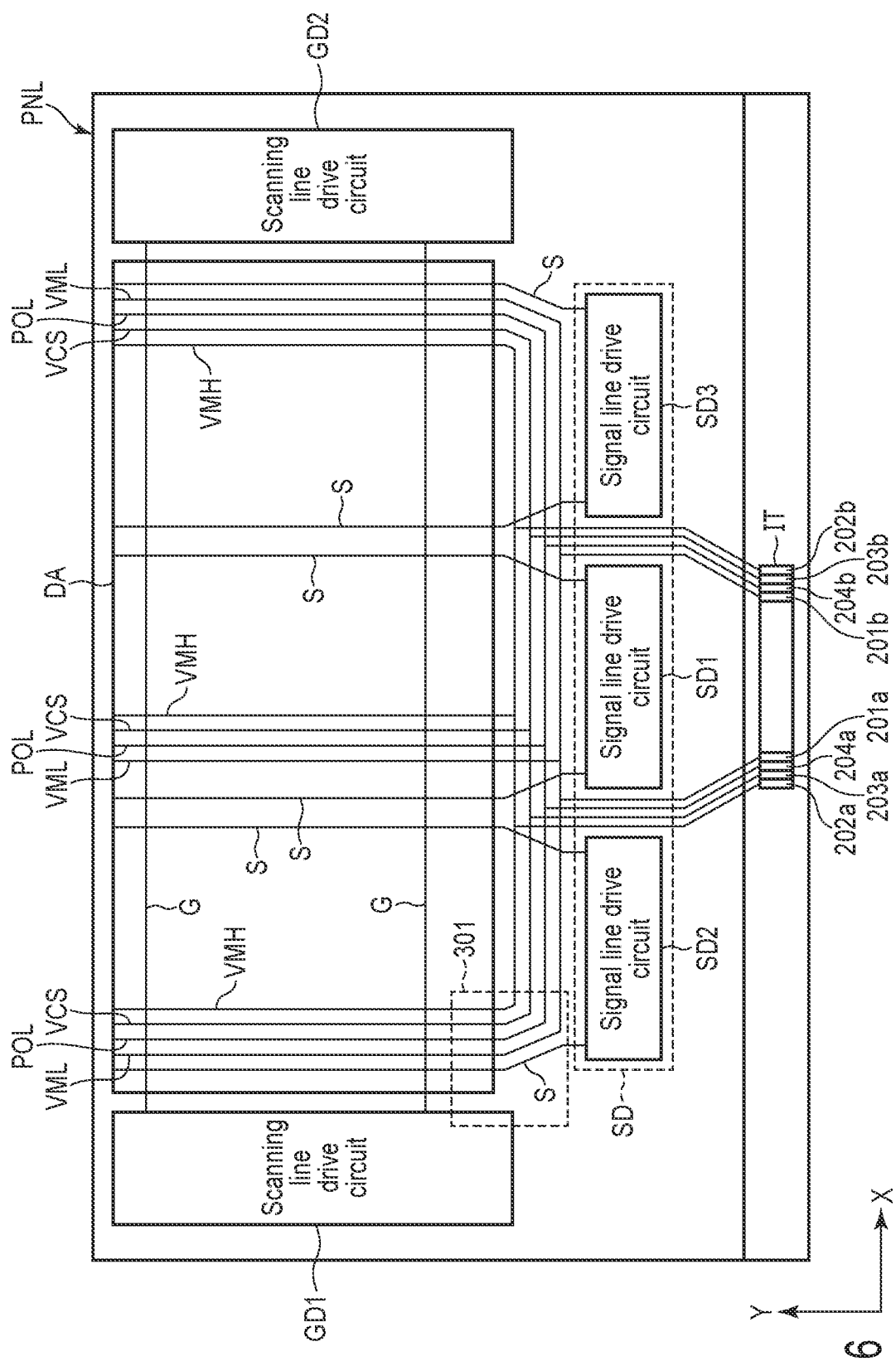
FIG. 6 is a view schematically showing positions where a first memory power line, a second memory power line, a first display potential line, and a second display potential line are formed on the display panel.

FIG. 6 is a view schematically showing positions (regions) where the first memory power line VML, the second memory power line VMH, the first display potential line VCS, and the second display potential line POL are formed on the display panel PNL. In the following descriptions, when the first memory power line VML, the second memory power line VMH, the first display potential line VCS, and the second display potential line POL are referred to as target lines for convenience when comprehensively described.

The configuration of including one scanning line drive circuit GD has been mainly described with reference to FIG. 2, but it is assumed in FIG. 6 that two scanning line drive circuits GD1 and GD2 are disposed at positions opposite to each other with the display area DA interposed therebetween. Each of the scanning line drive circuits GD1 and GD2 is disposed along the short side of the display area DA.

Furthermore, it is assumed that, in the embodiment, the signal line drive circuit SD is realized by a plurality of signal line drive circuits. In the example shown in FIG. 6, the signal line drive circuit SD includes a plurality of signal line drive circuits SD1 to SD3. The signal line drive circuits SD1 to SD3 are formed of different ICs, and are synchronously driven by using a common clock signal.

The plurality of signal line drive circuits SD1 to SD3 are separated from the display area DA in the second direction Y and are arranged in the first direction.

In addition, signal lines S for supplying pixel signals to the pixels PX (segment pixels SG) arrayed in the region (part of the display area DA) assigned to each of the signal line drive circuits SD1 to SD3 are connected to each of the plurality of signal line drive circuits SD1 to SD3.

In addition, an input terminal group IT including terminals (hereinafter referred to as input terminals) to input various voltages from the outside is provided on the display panel PNL, and the input terminals are connected to the target lines, respectively.

More specifically, in the example shown in FIG. 6, the input terminal group IT including input terminals 201a and 201b for inputting a low voltage to the first memory power line VML, input terminals 202a and 202b for inputting a high voltage to the second memory power line VMH, input terminals 203a and 203b for inputting the voltage XFRP (reference signal) to the first display potential line VCS, and input terminals 204a and 204b for inputting the voltage FRP (polarity signal) to the second display potential line POL.

The first memory power line VML connected to the input terminal 201a passes between the signal line drive circuits SD1 and SD2 in planar view, and is connected to the pixel circuits CR (memories 100) included in the segment pixels SG arrayed in the display area DA.

In addition, the first memory power line VML connected to the input terminal 201b passes between the signal line drive circuits SD1 and SD3 in planar view, and is connected to the pixel circuits CR (memories 100) included in the segment pixels SG arrayed in the display area DA.

The first memory power line VML connected to the input terminal 201a and formed between the signal line drive circuits SD1 and SD2, and the first memory power line VML connected to the input terminal 201b and formed between the signal line drive circuits SD2 and SD3 are connected to each other in regions between the display area DA and the signal line drive circuits SD (SD1 to SD3) as shown in FIG. 6. As a result, the first memory power lines VML can be connected to all the segment pixels SG arrayed in the display area DA.

In addition, the plurality of scanning lines G extending in the first direction X are connected to the scanning line drive circuits GD1 and GD2, and the first memory power lines VML described above extend in the second direction Y in the display area DA and intersect the plurality of scanning lines G.

The first memory power lines VML have been described, but the second memory power lines VMH, the first display potential lines VCS, and the second display potential lines POL are formed similarly to the first memory power lines VML. More specifically, the second memory power lines VMH, the first display potential lines VCS, and the second display potential lines POL are connected to the corresponding input terminals and are formed along with the first memory power lines VML.

In other words, the target lines in the embodiment extend in the vertical direction (i.e., the second direction Y) from the side where the input terminal group IT and the signal line drive circuits SD1 to SD3 are provided in the display area DA.

As shown in FIG. 6, the order of the target lines formed in the region on the scanning line drive circuit GD1 side of the display area DA is assumed to be different from the order of the target lines formed in the region on the scanning line drive circuit GD2 side of the display area DA. In the example shown in FIG. 6, the target lines are formed in the order of the first memory power line VML, the second display potential line POL, the first display potential line VCS, and the second memory power line VMH from the scanning line drive circuit GD1 side, in the region on the scanning line drive circuit GD1 side of the display area DA. In contrast, the target lines are formed in the order of the second memory power line VMH, the first display potential line VCS, the second display potential line POL, and the first memory power line VML from the scanning line drive circuit GD1, in the region on the scanning line drive circuit GD2 side of the display area DA. In other words, the order in which the target lines in the region on the scanning line drive circuit GD1 side of the display area DA is opposite to that in the region on the scanning line drive circuit GD2 side of the display area DA.

The example in which the order of the target lines in the region on the scanning line drive circuit GD1 side of the display area DA is different from that in the region on the scanning line drive circuit GD2 side of the display area DA has been described, but the orders in which the target lines are formed may be the same in the entire display area DA.

In addition, it has been described with reference to FIG. 6 that all the target lines are formed to pass between the two signal line drive circuits, but only some of the target lines may be formed between the two signal line drive circuits. In other words, for example, the first memory power line VML and the second memory power line VMH may be formed between the signal line drive circuits SD1 and SD2, and the first display potential line VCS and the second display potential line POL may be formed between the signal line drive circuits SD1 and SD3.

The positions where the target lines (first memory power line VML, second memory power line VMH, first display potential line VCS, and second display potential line POL) are formed will be specifically described below.

Figure 7:
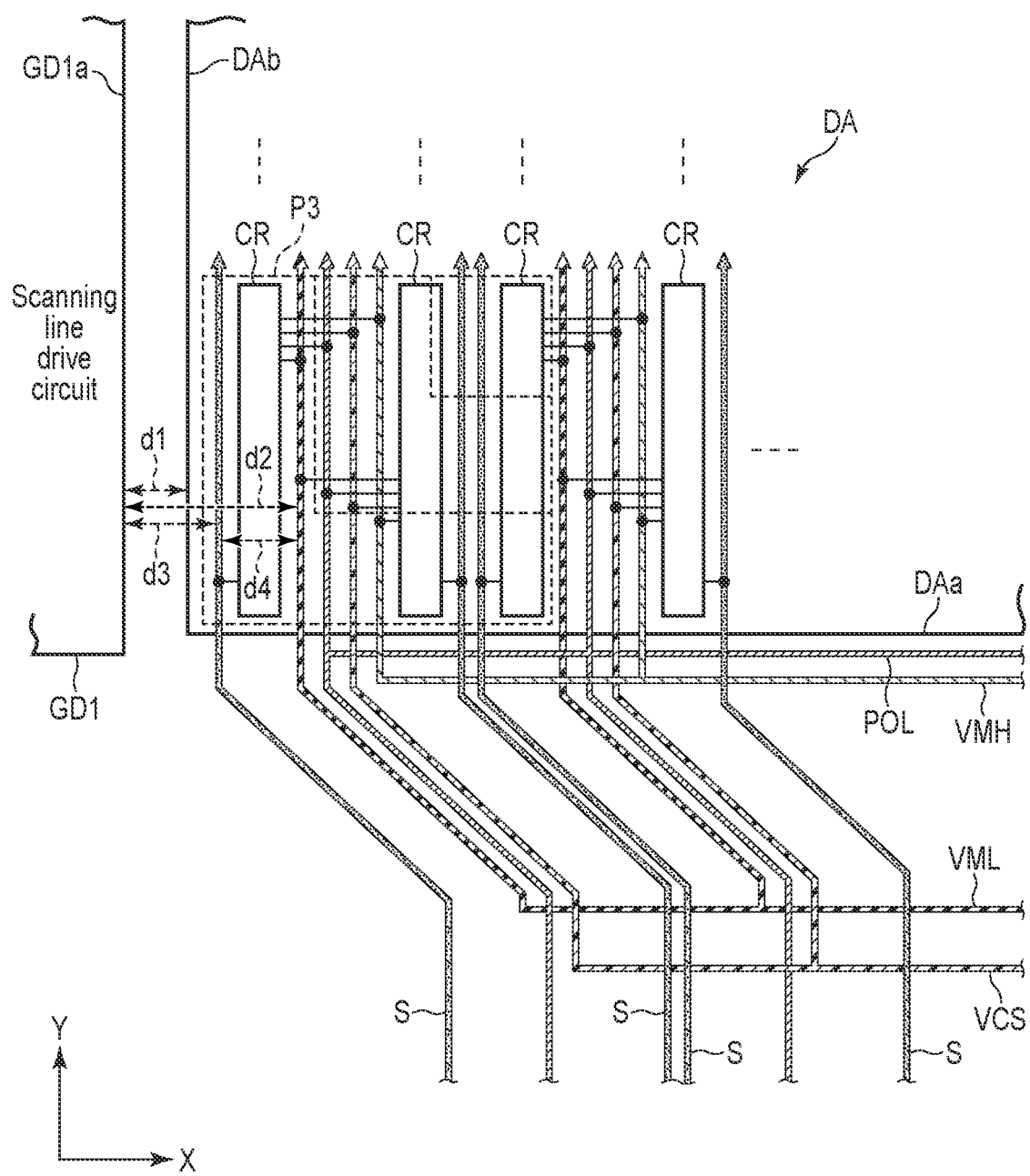
FIG. 7 is an enlarged view showing a region including a scanning line drive circuit and a part of a display area.

FIG. 7 is an enlarged view showing a region 301 including parts of the scanning line drive circuit GD1 and the display area DA shown in FIG. 6.

When it is assumed that the display area DA has a rectangular shape as shown in FIG. 2 described above, the target lines extend from the input terminal group IT in the second direction Y to reach the display area DA as shown in FIG. 7. An end portion DAa of the display area DA is defined by an outermost edge of the segment pixel SG provided on the outermost side of the display area DA. The outermost segment pixel includes a dummy pixel that does not substantially contribute to the display. End portions other than the end portion DAa of the display area DA are also formed similarly. In addition, the outermost edge of the segment pixel SG that defines the end portion DAa of the display area DA is, more specifically, the outermost edge of the pixel circuit CR of the segment pixel SG, and is defined by end portions of the lines and the switch circuit that constitute the pixel circuit CR. In other words, when a dummy pixel does not exist a boundary between the display area DA and the non-display area (frame region) NDA is defined by the edge of the pixel circuit CR of the segment pixel SG located at the outermost position, and when a dummy pixel exists a boundary between the display area DA and the non-display area NDA is defined by the edge of the pixel circuit provided in the dummy pixel.

In addition, the target lines are connected to the pixel circuit CR of each segment pixel SG. Although shown briefly in FIG. 7, more specifically, the first memory power line VML and the second memory power line VMH among the target lines are connected to the memory 100 shown in FIG. 3. In addition, the first display potential line VCS and the second display potential line POL among the target lines are connected to the switches SW2 and SW3 shown in FIG. 3, respectively.

The signal line S and the scanning line G are formed in different layers as described above and, in the display area DA, the target lines (mainstream lines) are formed in the same layer as the signal line S, and lead lines (branch lines) from the target lines to each circuit are formed in the same layer as the scanning line G. In the embodiment, the mainstream line and the branch line of each line can be crossed by using such two-layer metal lines.

As shown in FIG. 7, the target lines are shared by at least two pixel circuits CR (segment pixels SG) disposed adjacent to each other in the first direction X.

In addition, only four pixel circuits CR are shown in FIG. 7 for convenience, but the pixel circuits CR are arranged at positions overlapping with the display area DA so as to correspond to the segment pixels SG, and each of the pixel circuits is connected to the target lines.

Furthermore, each of the plurality of signal lines S extends in the second direction Y in the display area DA and extends to the non-display area NDA to be connected to the signal line drive circuits SD (SD1 to SD3), and supplies a pixel signal to each of the pixel circuits CR (segment pixels SG) arranged side by side in the second direction Y. At least some of the target lines and the plurality of signal lines S are desirably parallel to each other in the display area DA.

In the embodiment, the target lines (first memory power line VML, second memory power line VMH, first display potential line VCS and second display potential line POL) extend from the end portion DAa side of the display area DA, i.e., the side of the non-display area NDA where the terminal is provided toward the display area DA, and are provided without passing through the other region such as the side portion where the scanning line drive circuit GD1 is provided.

As shown in FIG. 7, a distance (first distance d1) from the end portion GD1a on the display area DA side of the scanning line drive circuit GD1 to an end portion DAb on the scanning line drive circuit GD1 side of the display area DA is shorter than a distance (second distance d2) from the end portion GD1a to the target line. The scanning line drive circuit GD1 includes a shift register circuit, a buffer circuit, a power line for supplying power to these circuits, and the like, and the end portion GD1 of the scanning line drive circuit GD1 is defined by, for example, the outer edge of the power line, the switch element of the above circuit, or the like, but may be defined in the other manner.

In other words, the target line (first memory power line VML in the example shown in FIG. 7) formed at the position closest to the scanning line drive circuit GD1 is not formed in the region between the scanning line drive circuit GD1 and the display area DA, but is formed at a position which overlaps with the display area DA.

Furthermore, as shown in FIG. 7, the signal line S closest to the scanning line drive circuit GD1 among the plurality of signal lines S is formed along (or adjacent to) the end portion DAb of the display area DA, and a distance between the signal line S and the scanning line drive circuit GD1 is shorter than the distance between the signal line S and the target line.

In the embodiment, a configuration in which the target line is not formed between (the end portion GD1a of) the scanning line drive circuit GD1 and (the end portion DAb of) the display area DA can be realized by adopting the above-described configuration. As a result, the scanning line drive circuit GD1 can be disposed at a position as close as possible to the display area DA.

The scanning line drive circuit GD1 side has been described with reference to FIG. 7, and the scanning line drive circuit GD2 side is constituted similarly, which will not be described below in detail.

Figure 8:
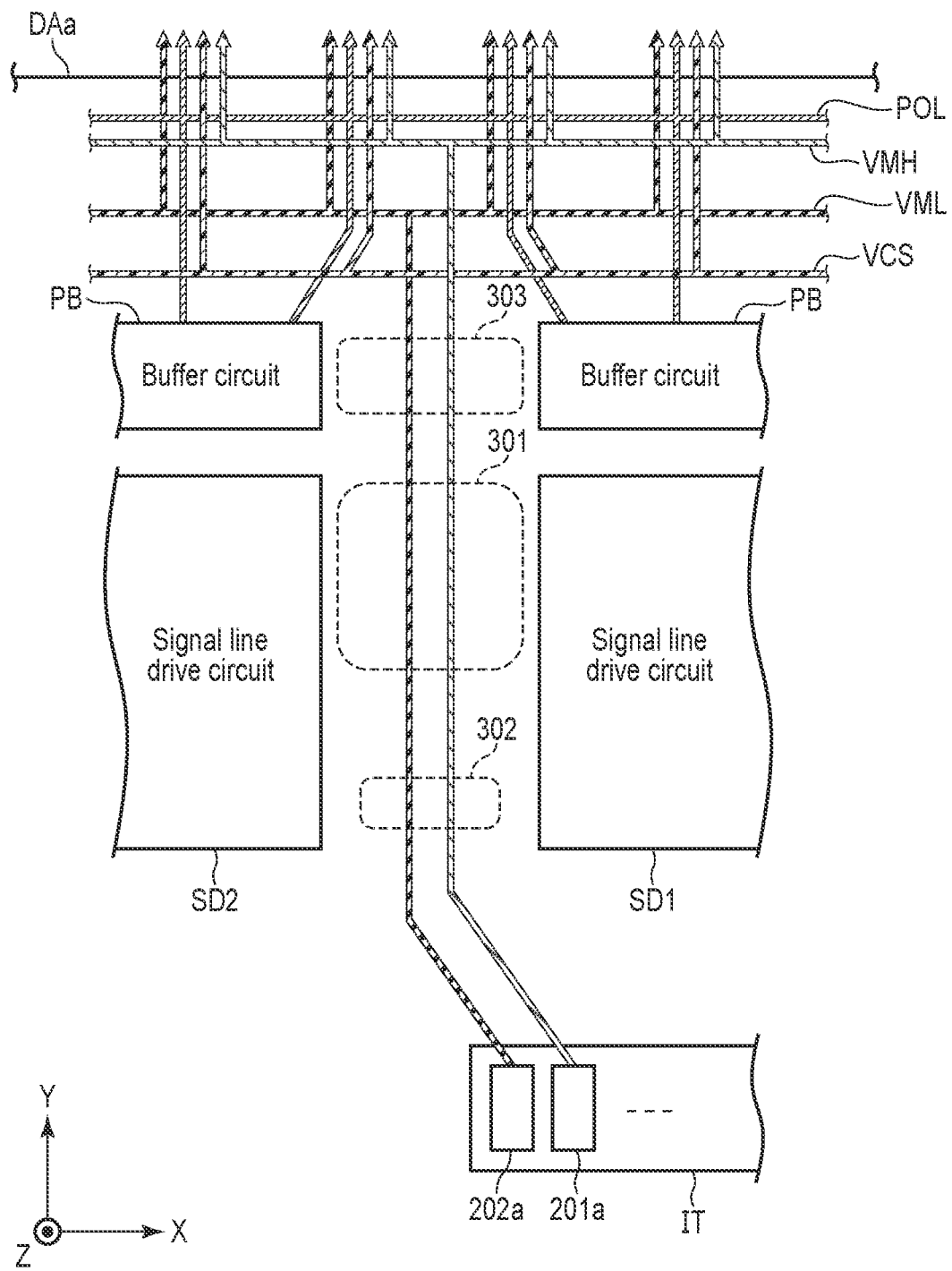
FIG. 8 is a view illustrating an example of a line formed between signal line drive circuits.

Next, the target line formed between the signal line drive circuits SD1 and SD2 shown in FIG. 6 will be described with reference to FIG. 8. In FIG. 8, the first memory power line VML and the second memory power line VMH are formed between the signal line drive circuits SD1 and SD2.

As described above, the target lines connected to the input terminal group IT are formed between the signal line drive circuits SD1 and SD2, and extend from the end portion DAa side of the display area DA to the second direction Y in the display area DA. In the region between the input terminal group IT and the signal line drive circuits SD (SD1 and SD2), each of the target lines (first memory power line VML and second memory power line VMH) may be formed of a plurality of lines.

The target lines may be subjected to multilayer wiring in, for example, regions 301 and 302 between the signal line drive circuits SD1 and SD2.

Figure 9:
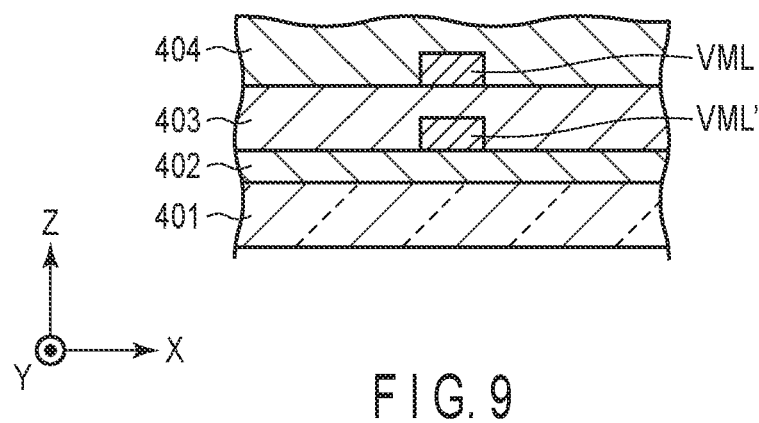
FIG. 9 is a diagram illustrating the multi-layer wiring of target lines.

Multilayer wiring of the target line (first memory power line VML in this case) will be described with reference to FIG. 9. FIG. 9 shows an example of a cross section in the region 301 between the above-described signal line drive circuits SD1 and SD2.

As shown in FIG. 9, for example, an insulating substrate 401 such as a glass substrate is covered with a first insulating layer 402, in a region 303. An auxiliary line VML' of the first memory power line VML is formed on the first insulating layer 402. A second insulating layer 403 covers the first insulating layer 402 and the auxiliary line VML'. In addition, the first memory power line VML is formed on the second insulating layer 403. A third scanning layer 404f covers the second insulating layer 403 and the first memory power line VML.

In FIG. 9, a layer on which the second insulating layer 403 and the auxiliary line VML' are formed is the same as a layer on which the scanning line G is formed (hereinafter referred to as the first wiring layer), and a layer on which the third layer 404 and the first memory power line VML are formed is the same as a layer on which the signal line S is formed (hereinafter referred to as a second wiring layer).

In addition, the case where the target line (for example, the first memory power line VML) is subjected to multilayer wiring in the region 301 has been described, and the target line is also subjected to multilayer wiring in, for example, the region 302 in the same manner.

Figure 10:
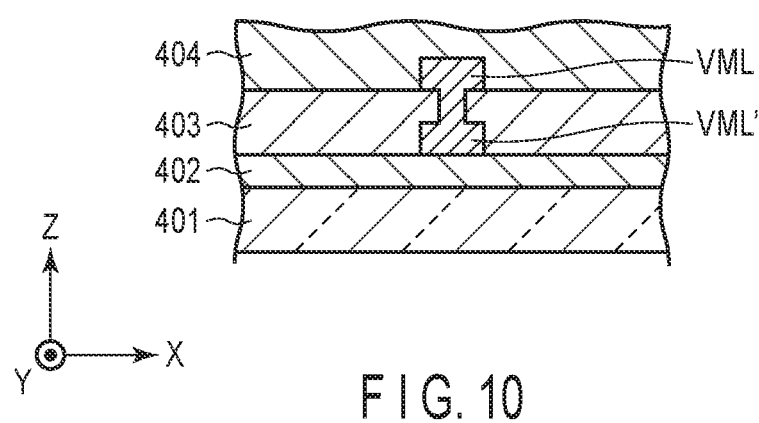
FIG. 10 is a view illustrating the multi-layer wiring of target lines.

In other words, in the display panel PNL, the first wiring layer and the second wiring layer are provided to overlap in a third direction Z (i.e., a direction perpendicular to the first direction X and the second direction Y) via one or more insulating layers and, for example, the target line is provided to extend in the second direction Y in the second wiring layer and the auxiliary line is formed at a position which overlaps with the target line in the first wiring layer, between the signal line drive circuits SD1 and SD2 in the regions 301 and 302 and the like. Furthermore, as shown in FIG. 10, the target line and the auxiliary line are in contact with each other at one or more positions in either or both of the regions 301 and 302.

For this reason, in the embodiment, the target line is at least partially subjected to multilayer wiring (two-layer wiring) in the regions 301 and 302 between the signal line drive circuits SD1 and SD2 and, accordingly, the resistance is reduced and the redundancy is secured.

The description returns to FIG. 8 again, and buffer circuits (POL buffers) PB are provided on the display panel PNL. The buffer circuit is configured to boost the polarity signal supplied to the pixel circuit CR, and is connected to at least the second display potential line POL. In the embodiment, the target lines may be subjected to multilayer wiring in the region 303 between the buffer circuits PB. In the configuration shown in FIG. 8, the first potential display line VCS has a fixed potential, and lines are formed from the terminal to the display area DA without passing through the buffer circuits. In addition, when the first display potential line VCS and the second display potential line POL have phases opposite to each other in an alternating signal, a configuration which boosts a signal supplied to the first display potential line VCS by the buffer circuits can be employed.

The signal line drive circuit SD includes three signal line drive circuits SD1 to SD3 in FIG. 6 describe above, and the signal line drive circuit SD may be configured to include more signal line drive circuits.

In such a configuration, the target lines may be formed as shown in, for example, FIG. 11. The signal line drive circuit SD includes the signal line drive circuits SD11 to SD14 in FIG. 11 and, in this case, the first display potential line VCS is formed between the signal line drive circuits SD11 and SD12, and the first memory power line VML and the second memory power line VMH are formed between the signal line drive circuits SD12 and SD13.

The second display potential line POL is connected to the buffer circuit PB as described above, and the second display potential line POL includes lines (buffer power lines) VPL and VPH for supplying a low voltage and a high voltage to the buffer circuit PB between the input terminal group IT and the buffer circuit PB. In the example shown in FIG. 11, the second display potential lines POL (buffer power lines VPL and VPH) are formed between the signal line drive circuits SD13 and SD14.

The first memory power line VML and the second memory power line VMH are formed between the signal line drive circuits SD1 and SD2 in FIG. 8, but all the target lines can also be formed between the signal line drive circuits SD1 and SD2 as shown in FIG. 6 described above.

Furthermore, the target lines formed between the signal line drive circuits SD1 and SD2 have been described with reference to FIG. 8 but, for example, the target lines formed between the signal line drive circuits SD2 and SD3 can also be configured similarly.

In FIG. 6 to FIG. 8, the first memory power line VML, the second memory power line VMH, the first display potential line VCS, and the second display potential line POL have been described as the target lines but, in the embodiment, a display device DSP (liquid crystal display device) adopting the MIP scheme is assumed and the target lines may be at least memory power lines (first memory power line VML and second memory power line VMH).

In addition, an example in which two scanning line drive circuits GD1 and GD2 are disposed at positions opposite to each other in the first direction X with the display area DA interposed therebetween has been described with reference to FIG. 6 to FIG. 7 but, in the embodiment, only one scanning line drive circuit GD may be provided.

As described above, the embodiment includes the display panel PNL including the display area DA in which a plurality of segment pixels SG including the memory 100 are arrayed, the scanning line drive circuit GD disposed in the first direction X with respect to the display area DA, and the memory power lines (first memory power line VML and second memory power line VMH) extending in the second direction Y and supplying power (a potential) to the memory 100, and the memory power lines are formed such that the distance from the scanning line drive circuit GD to the display area DA is shorter than the distance from the scanning line drive circuit GD to the memory power lines.

In the embodiment, with such a configuration, a memory power line does not need to be formed between the scanning line drive circuit GD and the display area DA, the scanning line drive circuit GD can be disposed closely to the display area DA, and narrowing the frame can be thereby realized.

In addition, as the display panel PNL becomes larger and has higher definition, the current becomes larger at the time of rewriting the pixel signal in the memory 100 provided in each segment pixel SG and charging and discharging the pixel electrode PE. For this reason, for example, when the wiring resistance of the memory power line or the like is not sufficiently low, a voltage drop occurs particularly at a position far from the power supply (terminal), which causes operation failure and deterioration of image quality. The reduction of the wiring resistance can be realized by thickening the line (width), but this may hinder the narrowing of the frame.

In contrast, in the embodiment, the input terminal group IT is disposed at a position opposed to the display area DA with the plurality of signal line drive circuits SD1 to SD3 interposed therebetween, and the memory power lines connected to the input terminal group IT is formed between the plurality of signal line drive circuits SD1 to SD3 (third drive circuits). According to such a configuration, since the length (line distance) of the memory power lines can be shortened, the resistance can be reduced.

In other words, in the embodiment, both the above-mentioned narrowing of the frame and the improvement of image quality (that is, higher image quality) based on lowering of the line resistance can be achieved.

Furthermore, in the embodiment, further reduction in the resistance can be realized by forming, for example, the memory power lines in a plurality of layers overlapping in planar view between the plurality of signal line drive circuits SD1 to SD3.

In addition, in the embodiment, the layout efficiency can be improved (i.e., the number of memory power lines formed in the display area DA can be reduced and space saving can be realized) by the configuration that the memory power lines are shared by at least two segment pixels SG opposed with the memory power lines interposed therebetween.

In the embodiment, at least the memory power lines (first memory power line VML and second memory power line VMH) may be configured not to be formed between the scanning line drive circuit GD and the display area DA, and further narrowing the frame can be realized by forming the display potential lines (first display potential line VCS and second display potential line POL) that supply voltages to the pixel electrodes PE along the memory power lines, too, in the same manner.

Furthermore, it has been described that in the present embodiment, the display panel PNL includes the scanning line drive circuits GD1 and GD2 (first and second drive circuits) disposed at positions opposed to each other in the first direction X with the display area DA interposed therebetween but, in such a configuration, the memory power lines (and the display potential lines) may be formed such that the distance (first distance) from the scanning line drive circuit GD1 to the display area DA is shorter than the distance (second distance) from the scanning line drive circuit GD1 to the memory power lines and that the distance (third distance) from the scanning line drive circuit GD2 to the display area DA is shorter than the distance (fourth distance) from the scanning line drive circuit GD2 to the memory power lines.

It has been described that the distance from the scanning line drive circuit GD to the display area DA is shorter than the distance from the scanning line drive circuit GD to the memory power lines, but the embodiment may be configured not to form the memory power lines between the scanning line drive circuit GD and the display area DA as described above and, for example, the memory power line formed at the position closest to the scanning line drive circuit GD may be formed at a position overlapping with the display area DA or the memory power line may be formed at a position farther from the scanning line drive circuit GD than the signal line S formed at the position closest to the scanning line drive circuit GD. Alternatively, for example, the distance (d3) between the signal line S formed at the position closest to the scanning line drive circuit GD and the scanning line drive circuit GD may be shorter than the distance (d4) between the signal line S and the memory power lines (d3<d4).

Next, the positions (regions) where the first memory power line, the second memory power line, the first display potential line, and the second display potential line (target lines) are formed in the display device DSP (display panel PNL) according to a modified example of the embodiment will be described with reference to FIG. 12.

The same portions as those in FIG. 6 described above are denoted by the same reference numerals, and their detailed description will be omitted. The portions different from those in FIG. 6 will be mainly described here.

As shown in FIG. 12, the modified example of the embodiment is different from the configuration shown in FIG. 6 described above in that at least a part of the target lines (for example, a memory power line) is formed further outside the outermost signal line drive circuit SD1 (SD3).

According to the modified example of the embodiment, all the target lines do not need to be consolidated between the signal line drive circuits SD1 and SD2 and between the signal line drive circuits SD1 and SD3, but can be dispersed outside the signal line drive circuits SD2 and SD3 (i.e., sides of the scanning line drive circuits GD1 and GD2).

When a part of the target line is disposed outside the signal line drive circuits SD2 and SD3, a plurality of input terminal groups IT are desirably provided as shown in FIG. 12. In the example shown in FIG. 12, input terminal groups IT1 to IT3 are provided.

The input terminal group IT1 is the same as the input terminal group IT shown in FIG. 6, and includes input terminals 201*a* to 204*a* and input terminals 201*b* to 204*b*. In addition, the input terminal group IT2 includes input terminals 201*c* to 204*c* corresponding to the input terminals 201*a* to 204*a* of the input terminal group IT1, and input terminals 201*d* to 204*d* corresponding to the input terminals 201*b* to 204*b* of the input terminal group IT1. Furthermore, the input terminal group IT3 includes input terminals 201*e* to 204*e* corresponding to the input terminals 201*a* to 204*a* of the input terminal group IT1, and input terminals 201*f* to 204*f* corresponding to the input terminals 201*b* to 204*b* of the input terminal group IT1.

In this case, the first memory power line VML connected to the input terminal 201*a* of the input terminal group T1 and the first memory power line VML connected to the input terminal 201*d* of the input terminal group T2 merge in a region between the input terminal groups T1 and T2 and the signal line drive circuits SD1 and SD2 and are formed between the signal line drive circuits SD1 and SD2.

Similarly, the second memory power line VMH connected to the input terminal 202a of the input terminal group T1 and the second memory power line VMH connected to the input terminal 202d of the input terminal group T2 merge in a region between the input terminal groups T1 and T2 and the signal line drive circuits SD1 and SD2 and are formed between the signal line drive circuits SD1 and SD2.

Figure 13:
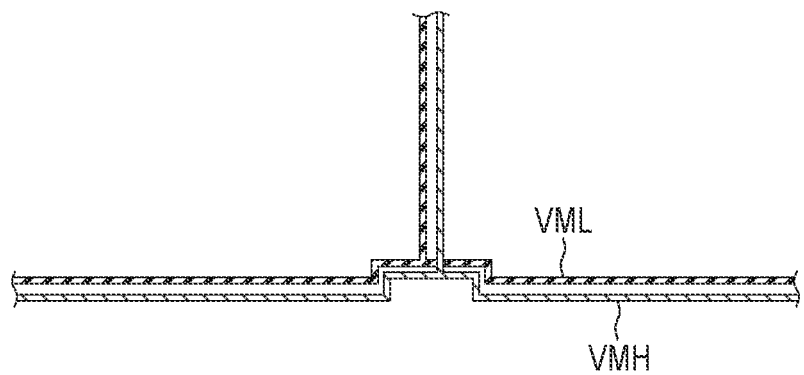
FIG. 13 is an enlarged view showing a portion where memory power lines are integrated.

A portion where the first memory power line VML merges and a portion where the second memory power line VMH merges in FIG. 12 are enlarged in FIG. 13.

The first memory power line VML and the second memory power line VMH have been described, but the first display potential line LCS and the second display potential line POL connected to the input terminals 203a and 204a of the input terminal group T1 and the input terminals 203d and 204d of the input terminal group T2 are configured similarly.

In addition, the target line connected to the input terminals 201b to 204b of the input terminal group T1 and the target line connected to the input terminals 201e to 204e of the input terminal group T3 are configured similarly.

In contrast, the target line connected to the input terminals 201c to 204c of the input terminal group T2 is formed to pass outside the signal line drive circuit SD2. Furthermore, the target line connected to the input terminals 201f to 204f of the input terminal group T3 is formed to pass outside the signal line drive circuit SD3.

According to the configuration of the modified example of the embodiment as described above, for example, since all the target lines do not need to be disposed between the plurality of signal line drive circuits SD1 to SD3, efficient voltage supply can be realized.

It has been mainly described that the display device according to the embodiment is the liquid crystal display device, but the embodiment is applicable to, for example, a display device which includes a memory and in which a memory power line for supplying electric power (a potential) to the memory is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display area where a plurality of pixels including switching elements and memories connected to the switching elements are arrayed;
a first drive circuit arranged adjacent to the display area in a first direction, the first drive circuit configured to supply a drive signal to a gate electrode included in each of the switching elements;
a memory power line extending in a second direction intersecting the first direction in the display area and configured to supply a potential to the memories;
a plurality of second drive circuits supplying pixel signals to the memories; and
an input terminal connected to an end portion of the memory power line,
wherein
an outer edge of the display area is defined by outermost edges of the pixels located on an outermost side in the display area,
a first distance from the first drive circuit to the outer edge of the display area is shorter than a second distance from the first drive circuit to the memory power line,
the input terminal and the display area are arranged in the second direction with a certain distance therebetween,
the plurality of second drive circuits are arranged in the first direction at positions between the display area and the input terminal, and
the memory power line passes through a region between two of the second drive circuits, from the input terminal to the display area.

2. The display device of claim 1, wherein
the memory power line is formed over a plurality of wiring layers overlapping with each other, in at least the region.

3. The display device of claim 1, wherein
at least a part of the memory power line extends from the input terminal to the display area, at a position further outside the second drive circuits in the first direction.

4. The display device of claim 3, wherein
the input terminal includes a first terminal and a second terminal arranged in the first direction, and
at least a part of the memory power line is connected to the first terminal and the second terminal.

5. The display device of claim 1, wherein
the memory power line is shared by at least two pixels opposed to each other with the memory power line interposed therebetween.

6. The display device of claim 1, wherein
a pixel electrode is provided in each of the pixels, and the display area further includes a display potential line for supplying a display voltage to each of the pixel electrodes, and
the display potential line extends along the memory power line in a second direction.

7. A display device comprising:
a display area where a plurality of pixels including switching elements and memories connected to the switching elements are arrayed;
a first drive circuit arranged adjacent to the display area in a first direction, the first drive circuit configured to supply a drive signal to a gate electrode included in each of the switching elements;
a memory power line extending in a second direction intersecting the first direction in the display area and configured to supply a potential to the memories;
a plurality of second drive circuits supplying pixel signals to the memories; and
an input terminal connected to an end portion of the memory power line,
wherein
at least one pixel circuit is provided between the first drive circuit and the memory power line,
the input terminal and the display area are arranged in the second direction with a certain distance therebetween,
the plurality of second drive circuits are arranged in the first direction at positions between the display area and the input terminal, and
the memory power line passes through a region between two of the second drive circuits, from the input terminal to the display area.

8. The display device of claim 7, wherein the memory power line is formed over a plurality of wiring layers overlapping with each other, in at least the region.

9. The display device of claim 7, wherein
at least a part of the memory power line extends from the input terminal to the display area, at a position further outside the second drive circuits in the first direction.

10. The display device of claim 9, wherein
the input terminal includes a first terminal and a second terminal arranged in the first direction, and
at least a part of the memory power line is connected to the first terminal and the second terminal.

11. The display device of claim 7, wherein
the memory power line is shared by at least two pixels opposed to each other with the memory power line interposed therebetween.

12. The display device of claim 7, wherein
a pixel electrode is provided in each of the pixels, and the display area further includes a display potential line for supplying a display voltage to each of the pixel electrodes, and
the display potential line extends along the memory power line in a second direction.

13. A display device comprising:
a display area where a plurality of pixels including switching elements and memories connected to the switching elements are arrayed;
a first drive circuit arranged adjacent to the display area in a first direction, the first drive circuit configured to supply a drive signal to a gate electrode included in each of the switching elements;
a memory power line extending in a second direction intersecting the first direction in the display area and configured to supply a potential to the memories,
a plurality of second drive circuits supplying pixel signals to the memories; and
an input terminal connected to an end portion of the memory power line,
wherein
the memory power line formed at a position closest to the first drive circuit is formed at a position overlapping with the display region,
the input terminal and the display area are arranged in the second direction with a certain distance therebetween,
the plurality of second drive circuits are arranged in the first direction at positions between the display area and the input terminal, and
the memory power line passes through a region between two of the second drive circuits, from the input terminal to the display area.

14. The display device of claim 13, wherein
the memory power line is formed over a plurality of wiring layers overlapping with each other, in at least the region.

15. The display device of claim 13, wherein
at least a part of the memory power line extends from the input terminal to the display area, at a position further outside the second drive circuits in the first direction.

16. The display device of claim 15, wherein
the input terminal includes a first terminal and a second terminal arranged in the first direction, and
at least a part of the memory power line is connected to the first terminal and the second terminal.

17. The display device of claim 13, wherein
the memory power line is shared by at least two pixels opposed to each other with the memory power line interposed therebetween.

18. The display device of claim 13, wherein
a pixel electrode is provided in each of the pixels, and the display area further includes a display potential line for supplying a display voltage to each of the pixel electrodes, and
the display potential line extends along the memory power line in a second direction.

* * * * *